(12) United States Patent　　(10) Patent No.: US 7,069,286 B2
Gay　　(45) Date of Patent: Jun. 27, 2006

(54) SOLUTION SPACE PRINCIPLE COMPONENT-BASED ADAPTIVE FILTER AND METHOD OF OPERATION THEREOF

(75) Inventor: Steven L. Gay, Long Valley, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 738 days.

(21) Appl. No.: 10/256,882

(22) Filed: Sep. 27, 2002

(65) Prior Publication Data

US 2004/0062403 A1　Apr. 1, 2004

(51) Int. Cl.
*G06F 17/10*　(2006.01)
(52) U.S. Cl. ...................................... 708/322; 708/323
(58) Field of Classification Search ................ 708/322, 708/323
See application file for complete search history.

(56) References Cited

U.S. PATENT DOCUMENTS

| 5,777,910 A * | 7/1998 | Lu .............................. 708/323 |
| 6,526,141 B1 * | 2/2003 | Benesty et al. ........ 379/406.09 |
| 6,611,594 B1 * | 8/2003 | Benesty et al. ........ 379/406.09 |
| 6,744,886 B1 * | 6/2004 | Benesty et al. ........ 379/406.08 |
| 2002/0114445 A1 * | 8/2002 | Benesty et al. ........ 379/406.01 |
| 2004/0001450 A1 * | 1/2004 | He et al. .................... 370/286 |
| 2004/0015529 A1 * | 1/2004 | Tanrikulu et al. ........... 708/322 |
| 2004/0260738 A1 * | 12/2004 | Kablotsky et al. .......... 708/322 |

* cited by examiner

*Primary Examiner*—D. H. Malzahn

(57) ABSTRACT

The present invention provides an adaptive filter. In one embodiment, the adaptive filter includes a solution vector generator that develops a sparse expression of an initial solution vector. In addition, the adaptive filter includes a proportionate normalized least mean squares (PNLMS) analyzer, coupled to the solution vector generator, that employs the sparse expression to converge upon at least one coefficient for the adaptive filter.

19 Claims, 6 Drawing Sheets

SOLUTION SPACE PRINCIPLE COMPONENT-BASED ADAPTIVE FILTER AND METHOD OF OPERATION THEREOF

TECHNICAL FIELD OF THE INVENTION

The present invention is directed, in general, to adaptive filters and, more specifically, to a solution-space principle component-based adaptive filter and a method of attaining filter convergence that provides superior adaptive filtering.

BACKGROUND OF THE INVENTION

Adaptive filters are used in many applications throughout signal processing, including, for example, echo cancellers, channel equalizers and speech coders. The fundamental use of adaptive filters is for tracking changes in the underlying parameters of these systems. Any improvement that improves this tracking ability often translates into an improvement in the purpose to which the adaptive filter is put.

Perhaps the most common algorithm in use today is the Proportionate Normalized Least Mean Square (PNLMS) algorithm. Those skilled in the pertinent art understand that the PNLMS algorithm employed with an adaptive filter has been shown to provide relatively fast convergence and tracking when the underlying system parameters are sparse. Such results are especially true in the problem of network echo cancellation. When employed in an adaptive filter, the PNLMS algorithm has been provided much faster convergence and tracking than the more antiquated Normalized Least Mean Squares (NLMS) adaptive filter algorithm when the solution is sparse in non-zero terms.

Unfortunately, the basis set of vectors typically selected by such conventional algorithms (e.g., PNLMS and NLMS, to name a few) do not account for the "sparseness" of the solution vectors produced by these algorithms. It is known that the adaptive filters employing certain algorithms, such as the popular PNLMB algorithm, provide fast convergence and tracking when the underlying system parameters are sparse. However, since even the advanced PNLMB algorithm, as well as other conventional algorithms, does not focus on the sparseness of the system parameters in which they are employed, their value in non-sparse systems has proven to be limited. In fact, in many situations, the convergence and tracking provided by the older NLMS algorithm is faster than that provided by the PNLMS algorithm when employed in non-sparse systems.

Accordingly, what is needed in the art is way to prepare parameters derived from a non-sparse system such that they are rendered suitable for efficient processing by a PNLMS algorithm.

SUMMARY OF THE INVENTION

To address the above-discussed deficiencies of the prior art, the present invention provides an adaptive filter. In one embodiment, the adaptive filter includes a solution vector generator that develops a sparse expression of an initial solution vector. In addition, the adaptive filter includes a proportionate normalized least mean squares (PNLMS) analyzer, coupled to the solution vector generator, that employs the sparse expression to converge upon at least one coefficient for the adaptive filter. The sparse expression renders the initial solution vector suitable for efficient processing by the PNLMS analyzer.

In another aspect, the present invention provides a method of converging on at least one filter coefficient. In one embodiment, the method includes developing a sparse expression of an initial solution vector, and employing the sparse expression in a proportionate normalized least mean squares (PNLMS) process to converge upon at least one coefficient for the adaptive filter.

In yet another aspect, the present invention provides an adaptive, echo canceling filter. In one embodiment, the adaptive, echo cancelling filter includes a solution vector generator that develops a sparse expression of an initial, time-varying solution vector. In addition, the adaptive, echo cancelling filter further includes a proportionate normalized least mean squares (PNLMS) analyzer, coupled to the solution vector generator, that employs the sparse expression to converge upon at least one coefficient for the adaptive filter.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the present invention.

BRIEF DESCRIPTION OF THE DRAWINGS

For a more complete understanding of the present invention, reference is now made to the following detailed description taken in conjunction with the accompanying Figures. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

The present invention provides an adaptive filter using an algorithm that extends the well-known proportionate normalized least mean squares (PNLMS) algorithm such that it operates efficiently with respect to parameters derived from a non-sparse system. As discussed above, an adaptive filter employing the PNLMS algorithm provides relatively fast convergence and tracking when the underlying system parameters are sparse. Those who are skilled in the art understand that the "sparseness" of a vector is a function of the chosen basis vectors. It is known that a given set of random vectors may be expressed most succinctly as a linear combination of the "principle components" of the generating random process. As used herein, the principle components of a vector are defined as the eigenvectors of the vectors' covariance matrix. By choosing the principle components of a statistical sampling of solution vectors as a basis set, the solution vectors may be represented more sparsely than is typically found in the conventional application of the PNLMS algorithm in adaptive filters. Thus, according to the present invention, the PNLMS algorithm operating under such a selected basis set converges substantially faster than under the original basis set. As a result, one algorithm provided by the present invention may be referred to as "principle component PNLMS" or, for simplicity, PCP.

However, before explaining the PCP algorithm of the present invention, vector "sparseness" as used by the present invention should be defined. More specifically, the sparseness of a vector will be given a mathematical definition, using different so-called $L_p$ norms. The $L_p$ norm of the vector x is defined in equation (1).

$$\|x\|_p = \sum_i \sqrt[p]{|x|^p} \quad (1)$$

Figure 1:
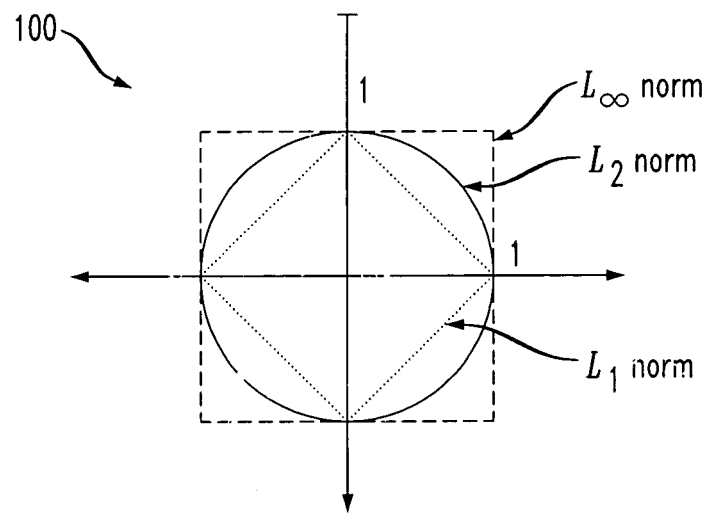
FIG. 1 illustrates unit circles for a variety of p-norms.

The magnitude of the Euclidean, or $L_2$, norm is independent of the choice of basis. This is not true in general for p-norms with $p \neq 2$. This can be seen in FIG. 1, which illustrates unit circles for p-norms for $p=\{1,2,\infty\}$. In addition, Table 1 shows the magnitudes of points under various norms with basis vectors (1,0) and (0,1).

TABLE 1

Magnitudes of points under various norms with basis vectors (1,0) and (0,1).

| Point | $L_1$ norm | $L_2$ norm | $L_\infty$ norm |
|---|---|---|---|
| (1,0) | 1 | 1 | 1 |
| ($1/\sqrt{2}$, $1/\sqrt{2}$) | $\sqrt{2}$ | 1 | $1/\sqrt{2}$ |

For the sparse point (1,0) the magnitude is the same for all norms, but for the non-sparse point, $(1/\sqrt{2}, 1/\sqrt{2})$ the magnitude varies depending on the norm chosen. It is greater than 1, (i.e., $\sqrt{2}$), under the $L_1$ norm, equal to 1 under the $L_2$ norm and, less than 1, (i.e., $1/\sqrt{2}$) under the $L_\infty$ norm. If, however, the basis vectors are rotated to $(1/\sqrt{2}, 1/\sqrt{2})$ and $(-1/\sqrt{2}, 1/\sqrt{2})$ then magnitudes of the points change under the $L_1$ and $L_\infty$ norms, but not the $L_2$. Table 2 shows the magnitudes of points under various norms with basis vectors $(1/\sqrt{2}, 1/\sqrt{2})$ and $(-1/\sqrt{2}, 1/\sqrt{2})$. Therefore, it is convenient to use non-$L_2$ norms in measures of sparseness.

TABLE 2

Magnitudes of points under various norms with basis vectors $(1/\sqrt{2}, 1/\sqrt{2})$ and $(-1/\sqrt{2}, 1/\sqrt{2})$

| Point | $L_1$ norm | $L_2$ norm | $L_\infty$ norm |
|---|---|---|---|
| (1,0) | $\sqrt{2}$ | 1 | $1/\sqrt{2}$ |
| ($1/\sqrt{2}$, $1/\sqrt{2}$) | 1 | 1 | 1 |

This suggests a class of measures, $$S_{p_1 p_2}(x) = \frac{\|x\|_{p_1}}{\|x\|_{p_2}}, \quad (2)$$

where $$p_2 < p_1 \quad (3)$$

For the sake of clarity, the instance of equation (2) will be used, as set forth in equation 4.

$$S_{21}(x) = \frac{\|x\|_2}{\|x\|_1}. \quad (4)$$

Table 3 shows that for the sparsest point (1,0), $S_{21}$ takes on the value 1, and for the least sparse point $(1/\sqrt{2}, 1/\sqrt{2})$, it takes on its smallest value for a 2-dimensional vector, $1/\sqrt{2}$. In general, for an L-dimensional vector the smallest value $S_{21}$ takes on is $1/\sqrt{L}$.

TABLE 3

$S_{21}$ under basis vectors (1,0) and (0,1).

| Point | $S_{21}$ |
|---|---|
| (1,0) | 1 |
| ($1/\sqrt{2}$, $1/\sqrt{2}$) | $1/\sqrt{2}$ |

As discussed in greater detail below, PCP extends the application of the PNLMS algorithm to certain non-sparse systems by applying PNLMS using the principle components of the underlying system as basis vectors. Room acoustic echo systems are possible examples of such non-sparse systems, however the present invention is not so limited. Simulations of acoustic echo paths and acoustic echo cancellers indicate that an adaptive filter employing the PCP algorithm according to the principles of the present invention converges and tracks much faster than adaptive filters employing the classical normalized least mean squares (NLMS) algorithm or the fast recursive least squares (FRLS) algorithm. However, before a complete understanding of the PCP algorithm may be had, the use of the traditional PNLMS algorithm in an adaptive filter must first be understood.

The traditional PNLMS algorithm will be discussed herein in the context of an echo cancellation problem. The variables, including the signals, vectors, and matrices, used in the description and accompanying equations set forth below are set forth in Table 4.

TABLE 4

Variables Defined

| | |
|---|---|
| $\chi_n$ | Far-end signal which excites the echo path |
| $x_n = [\chi_n, \ldots, \chi_{n-L+1}]^T$ | excitation vector |
| $h_{ep} = [h_0, \ldots, h_{L-1}]^T$ | true echo path impulse response solution vector |
| $v_n$ | near-end signal, or near-end noise |
| $y_n = x_n^T h_{ep} + v_n$ | combination of the echo and the near-end signals |
| $h_n = [h_{0,n}, \ldots, h_{L-1,n}]^T$ | adaptive filter coefficient vector |
| $e_n = y_n - x_n^T h_{n-1}$ | error or residual-echo signal |
| $G_n = \text{diag}\{g_{0,n}, \ldots, g_{L-1,n}\}$ | diagonal individual step-size matrix |
| $\mu$ | the "stepsize" parameter and is chosen in the range $0 < \mu < 1$ |
| $\delta$ | a small positive number known as the regularization parameter (this prevents division by zero in equation (2) and elsewhere when $x_n^T x_n$, is very small) |

An NLMS algorithm adaptive filter iteration involves the two steps: the error calculation, as set forth in equation (5), and the coefficient vector update, as set forth in equation (6).

$$e_n = y_n - x_n^t h_{n-1}, \quad (5)$$

$$h_n = h_{n-1} + \mu x_n (x_n^t x_n + \delta)^{-1} e_n \quad (6)$$

A PNLMS algorithm adaptive filter iteration is similar to that of an adaptive filter employing the NLMS algorithm, except that in equation (6) a diagonal matrix, $G_n$ whose elements are roughly proportionate to the magnitude of the coefficient vector, is used to window the excitation vector, $x_n$, as set forth in equation (7), $$h_n = h_{n-1} + \mu G_n x_n (x_n^t G_n x_n + \delta)^{-1} e_n \quad (7)$$

where, $$G_n = f(\rho, \delta_p, h_{n-1}). \quad (8)$$

and where $f(\rho, \delta_p, h_{n-1})$, the series of steps that generate $G_n$, the proportionate diagonal matrix of the PNLMS algorithm, is produced by the steps provided by equation (14) through equation (17), which are discussed in greater detail below. As a result, the general form of the error calculation and coefficient update of an adaptive filter employing a PNLMS algorithm may be expressed as $$e_n = y_n - x_n^T h_{n-1}, \quad (9)$$

$$h_n = h_{n-1} + \mu r_n \quad (10)$$

where $r_n$ is the coefficient update vector at sample period n. One way to determine $r_n$ is to minimize a weighted version of its norm subject to the constraint that the a posteriori error, which is expressed as $$\dot{e}_n = y_n - x_n^T h_n = e_n - \mu x_n^T r_n, \quad (11)$$

is zero when $\mu$ is one. Hence, the cost function is written, $$C_n = \delta r_n^T G_n^{-1} r_n + (e_n - x_n^T r_n)^2. \quad (12)$$

For PNLMS, $G_n$ is diagonal with diagonal elements roughly proportional to the magnitude of the estimated coefficients.

Consider $h_{n-1}$ as a point in an L-dimensional space with basis vectors corresponding to the columns of an L-by-L identity matrix. When $h_{n-1}$ has only one large value, then the point that represents it in this space lies near one of the coordinate axes. According to the first term of equation (12), the cost of moving orthogonally to the axis is expensive (but not impossible), while moving parallel to it is relatively inexpensive. So, the cost function favors moving the coefficient estimate vector on trajectories roughly parallel to the basis vectors. This is equivalent to saying that the cost function favors sparse coefficient estimate vectors.

Using the matrix inversion lemma it can be seen that equation (12) may be minimized by, $$r_n = \mu G_n x_n (x_n^T G_n x_n + \delta)^{-1} e_n. \quad (13)$$

This is the PNLMS update vector. Note that if $G_n = I$ then equation (13) reduces to the standard regularized NLMS coefficient update. The individual step-size matrix is calculated from the coefficient vector of the previous sample period, in accordance with the steps set forth as equation (14) through equation (17), $$L_{max} = \max\{\delta_p, |h_{0,n-1}|, \ldots, |h_{L-1, n-1}|\} \quad (14)$$

$$\gamma_i = \max\{\rho L_{max}, |h_{i,n-1}|\} \quad 0 \leq i \leq L-1 \quad (15)$$

$$L_1 = \sum_{i=0}^{L-1} \gamma_i \quad (16)$$

$$(G_n)_{i,i} = \gamma_i / L_1 \quad 0 \leq i \leq L-1 \quad (17)$$

where $\delta_p$ and $\rho$ are small positive numbers. $\delta_p$ prevents the algorithm from misbehaving when the adaptive coefficients are all near zero (e.g., at initialization) and $\rho$ prevents individual coefficients from freezing when their magnitude is much smaller than the largest coefficient, $L_{max}$. Typically, $\delta_p \approx 0.01$ and $\rho \approx 5/L$. If $\rho$ is set to one, then $G_n = I$ and PNLMS behaves like NLMS.

Figure 2:
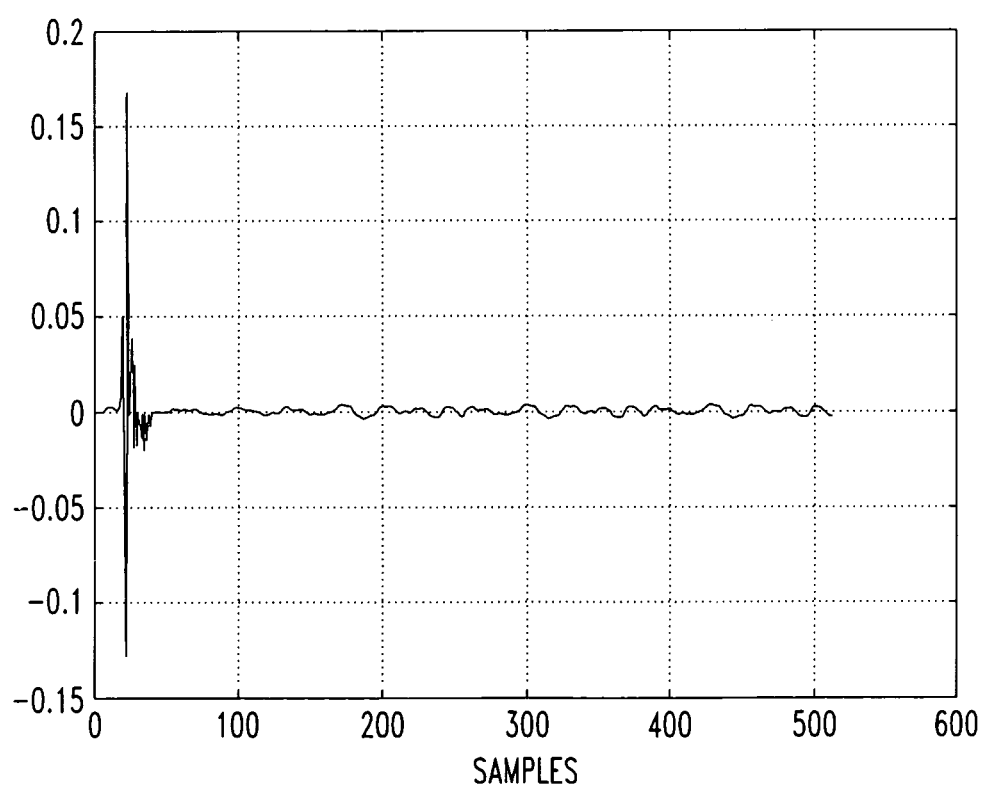
FIG. 2 illustrates a typical impulse response pertaining to a telephone network.
Figure 3:
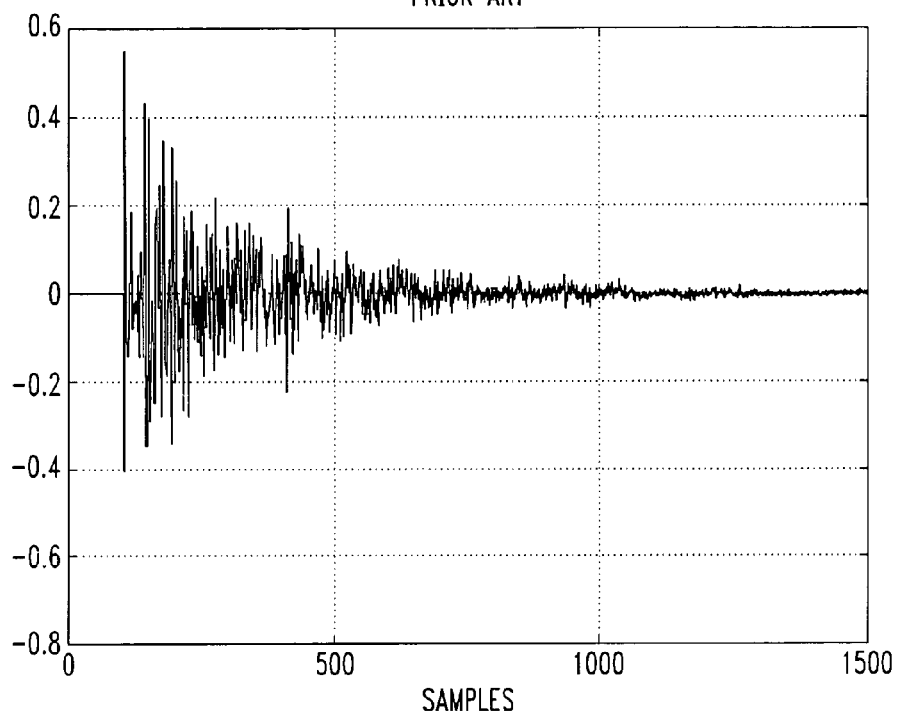
FIG. 3 illustrates a typical impulse response pertaining to a room.

When $h_{ep}$ is sparse and $h_{n-1}$ converges to it, the adaptive filter becomes effectively shorter because of $G_n$'s windowing of $x_n$. Since shorter adaptive filters converge faster than longer ones, the PNLMS convergence is accelerated. On the other hand, when $h_{ep}$ is dispersive, PNLMS typically has no advantage over NLMS, and, in fact, its convergence is usually significantly slower. This property of the PNLMS algorithm's convergence speed being dependent on the sparseness of the solution vector, $h_{ep}$, determines the proper application of PNLMS. Impulse responses of echo paths typically found in, for example, telephone networks, tend to be sparse while those of acoustic echo paths, for example, in offices and conference rooms, tend to be dispersive. FIGS. 2 and 3 show typical impulse responses pertaining to a telephone network and to a room, respectively. Also, their $S_{21}$ sparseness measure values are 0.12 and 0.01, respectively. As a result, PNLMS has been successfully used in network echo cancellers, but not in acoustic echo cancellers.

With the general steps involved in error calculation and coefficient vector update for a PNLMB adaptive filter in mind, how the PNLMS algorithm can operate under any arbitrary basis set may now be examined. In this example, the acoustic impulse response has been rotated with a linear transformation, as set forth in equation (18), $$b_{ep} = U h_{ep}. \quad (18)$$

where U is an L-by-L unitary matrix. Then, the substitutions set forth in equations (19) and (20) may be made in equations (5) and (6).

$$h_{n-1} = U^T b_{n-1} \quad (19)$$

$$s_n = U^T x_n. \quad (20)$$

Then, equation (5) may be rewritten as equation (21), to wit, $$e_n = y_n - s_n^T b_{n-1} \quad (21)$$

and equation (6) may be rewritten as equation (22), to wit, $$U^T b_n = U^T b_{n-1} + \mu U^T s_n (s_n^t U U^T s_n + \delta)^{-1} e_n. \quad (22)$$

After multiplying both sides of equation (22), from the left, by U, and recalling that for unitary matrices, $I = UU^T$, the result is equation (23). Thus, new equations (21) and (23) represent NLMS in the transformed domain.

$$b_n = b_{n-1} + \mu s_n (s_n^t s_n + \delta)^{-1} e_n. \quad (23)$$

The PNLMS algorithm may now be applied to the arbitrary basis set by defining a proportionate diagonal matrix as a function of b. This is set forth in equation (24). In addition, the PNLMS coefficient update in the transform domain is shown in equation (25).

$$M_n = f(\rho, \delta_p, b_{n-1}). \quad (24)$$

$$b_n = b_{n-1} + \mu M_n s_n (s_n^t M_n s_n + \delta)^{-1} e_n \quad (25)$$

Once the equations for performing the PNLMS algorithm under an arbitrary set of basis vectors, the defining of those basis vectors, in accordance with the principles of the present invention, may be completed. As discussed above, the basis vectors should be selected such that the sparseness of the parameters underlying the adaptive filter is maximized. However, in the PNLMB discussion presented above, the solution vector, $h_{ep}$, has been viewed as being fixed.

In practical applications though, the solution vector is almost always time varying; otherwise, an adaptive filter would be unnecessary in echo cancellation and similar applications. The manner in which $h_{ep}$ varies with time is, of course, application dependent. For example, in network echo cancellation, $h_{ep}$ changes very little during the period of a given telephone connection, but changes materially when a new connection is made. Conversely, in acoustic echo cancellation, $h_{ep}$ changes throughout the communication session as objects in the acoustic echo path (such as the conversation participants) move about the room.

Therefore, a time index must be added to the solution vector $h_{ep}(n)$, and is now viewed as the output of a random process. As such, the well know tool of principle components analysis (PCA) may be employed to find the most efficient, i.e., sparse, representation of the solution vector $h_{ep}(n)$. Specifically, letting the L-length column vector, $w_k$, be the $k^{th}$ principle component of the random process, the solution vector $h_{ep}(n)$ may be expressed as $$h_{ep}(n) = \sum_{k=0}^{L-1} w_k b_{i,ep}(n) = W b_{ep}(n), \quad (26)$$

where W is an L-by-L unitary matrix whose $k^{th}$ column is $w_k$.

According to PCA, if the solution vector process covariance matrix is defined as $$R_{hh} = E\{h_{ep}(n) h_{ep}^T(n)\}, \quad (27)$$

and its diagonal decomposition is defined as $$R_{hh} = WDW^T, \quad (26)$$

where D is diagonal and W is unitary, then the columns of W represent the principle component vectors and the corresponding diagonal elements of D are proportional to the probable contribution of that component. Most importantly, $b_{ep}(n)$ tends to be more sparse than $h_{ep}(n)$; this translates into faster convergence, among other advantages. Therefore, in a preferred embodiment of the present invention, a good choice for U in equation (18) is $W^T$. Thus, to find U for the acoustic echo cancellation problem, a sample covariance matrix can be constructed from many observations of the solution vector $h_{ep}(n)$, as set forth in equation $$\hat{R}_{hh} = \sum_{k=0}^{P} h_{ep}(k) h_{ep}^T(k), \quad (29)$$

and define $$U = \hat{W}^T, \quad (30)$$

where $\hat{W}$ is the unitary matrix in the diagonal decomposition of $\hat{R}_{hh}$.

To better understand the advantages of PCP according to the present invention, simulations of an object moving about a room, with reference to an image-derived model for finding acoustic impulse responses, will now be explored. In the simulations, microphone and loudspeaker positions are fixed (as is often the case in normal speakerphone use) and a perfectly absorbing spherical object is located at random positions about the room. The room is rectangular with different reflection coefficients on each wall, ceiling and floor. With each new location the impulse response is measured and added into the sample covariance matrix. It is recognized that the simulations are only a first order approximation of speakerphone usage in that they only take into account specular reflections and therefore ignore diffraction. However, because collecting hundreds to thousands of room impulse responses would be a somewhat daunting task, this first order approximation provides simulations sufficient to demonstrate the efficacy of the present invention. Table 5 sets forth the parameters used in the algorithms calculated during the various simulations discussed below.

TABLE 5

| Algorithm Parameters | |
|---|---|
| L | 512 |
| μ | 0.2 |
| ρ | .01 |
| $\delta_p$ | .01 |

TABLE 5-continued

Algorithm Parameters

| | |
|---|---|
| λ, effective length of the forgetting factor is FRLS | 2L<br>That is,<br>$\lambda = \dfrac{2L}{2L+1}$ |

Figure 4:
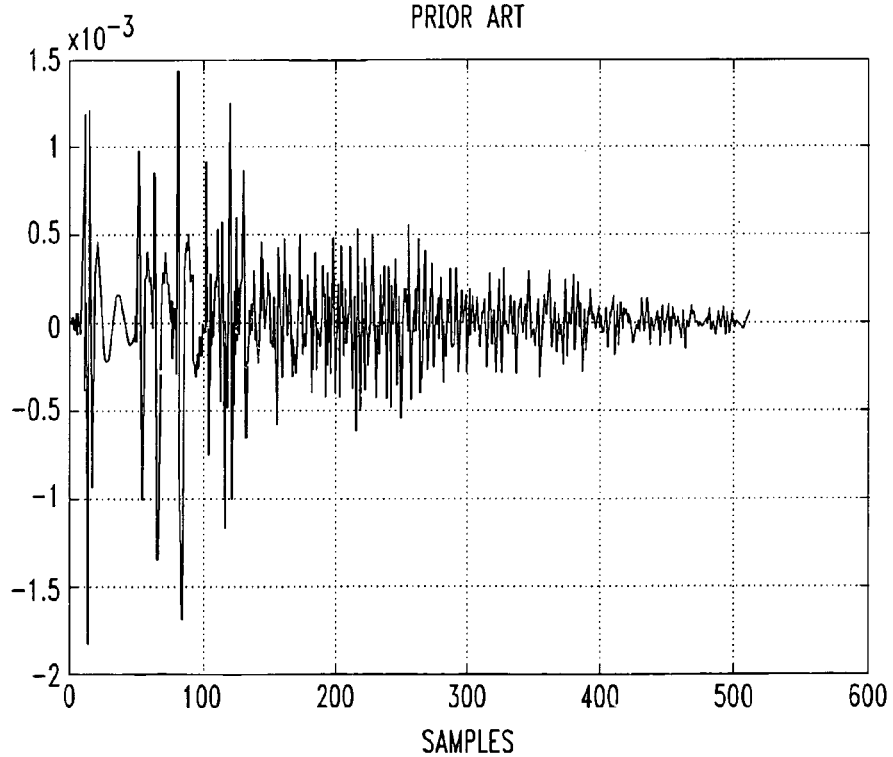
FIG. 4 illustrates a typical impulse response from a first simulation.
Figure 5:
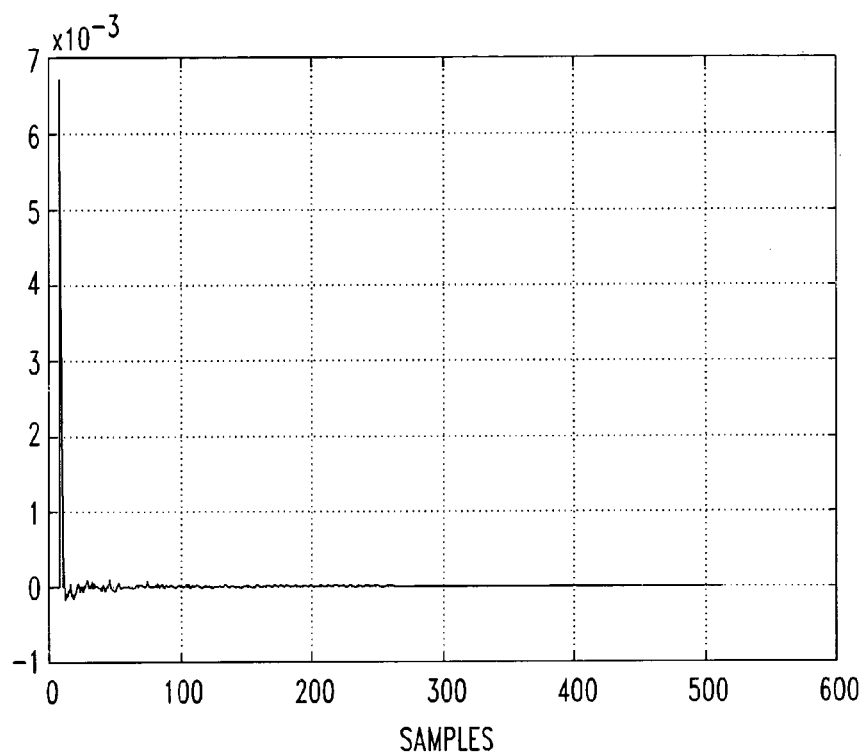
FIG. 5 illustrates the transform of the vector shown in FIG. 4.

FIG. 4 illustrates a typical impulse response from a first simulation. FIG. 5 illustrates the transform of the vector shown in FIG. 4. As may be seen, the transformed version illustrated in FIG. 5 is clearly sparser. The salient parameters in the first simulation are set forth in Table 6.

TABLE 6

Salient Parameters of First Simulation

| | |
|---|---|
| Room Dimensions | 6.4' by 8' by 6.4' |
| Reflection coefficients of the 6 walls | 0.91, 0.87, 0.95, 0.85, 0.8, 0.6 |
| Radius of the spherical absorbing object | 1.2' |
| Origin Location (0, 0, 0) | front lower left corner (the positive directions are back, up, and right) |
| Source/speaker coordinates | (0.64', 3.2', 3.2') |
| microphone coordinates | (0.64', 4.8', 3.2') |

In addition, the sampling rate in the simulations discussed herein is 8 kHz. Actually, the internal sampling rate of the room simulation is 80 kHz; however, the final impulse response is sub-sampled to 6 kHz.

Figure 6:
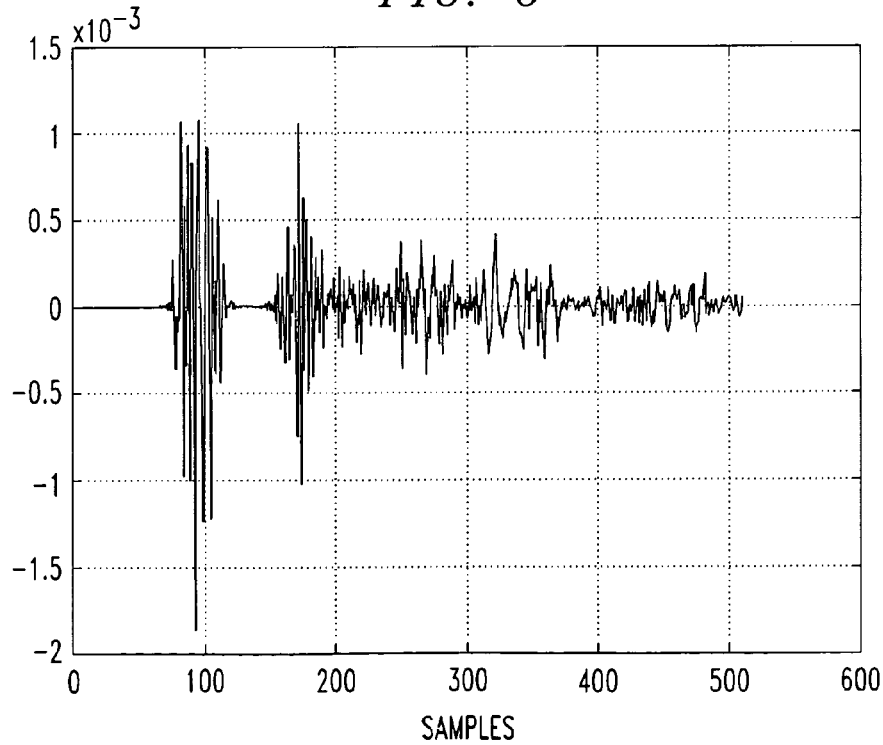
FIG. 6 illustrates the impulse response of a room where a spherical object is out of the direct path between a microphone and a loudspeaker.
Figure 7:
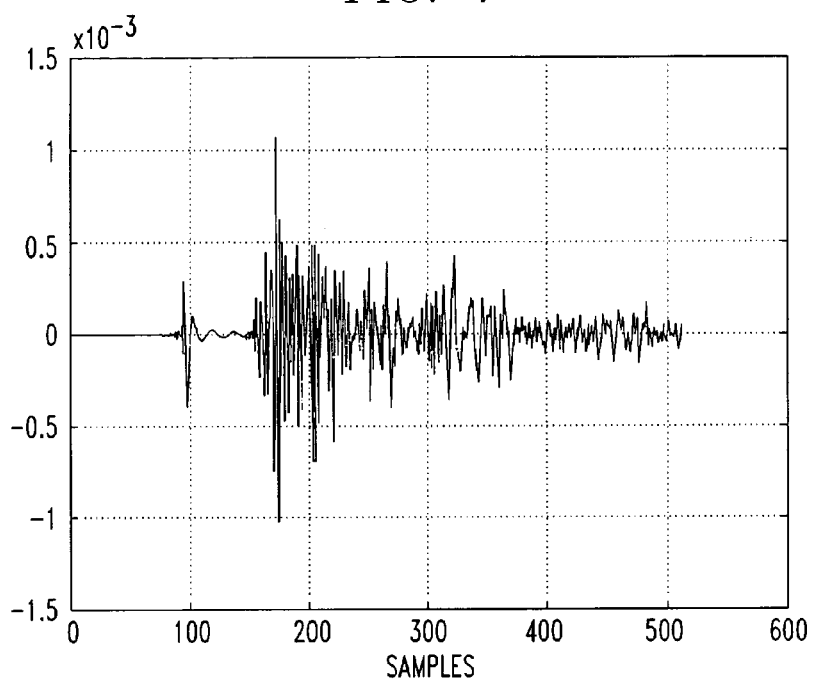
FIG. 7 illustrates the impulse response of a room with a spherical object is in the direct path between a microphone and a loudspeaker.

Turning to FIGS. 6 and 7, illustrated are impulse responses of the room during second and third simulations. Specifically, FIG. 6 illustrates the impulse response of the room where the spherical object is out of a direct path between the microphone and the loudspeaker. In the second simulation, the microphone coordinates were (0.64', 0.8', 0.64') and the loudspeaker position was in the farthest corner of the room, coordinates (5.76', 7.2', 5.76'). The object coordinates were (5.2', 1.2', 5.2'), which, as stated above, is out of the direct path between the microphone and the loudspeaker. FIG. 7 illustrates the impulse response of the room with the object coordinates of (3.2', 4', 2'), which is in the direct path between the microphone and the loudspeaker. Those skilled in the pertinent art will see from FIGS. 6 and 7 that the initial convergence when employing PCP in accordance with the principles of the present invention is materially faster than adaptive filters employing either NLMS or FRLS algorithms, even though the untransformed impulse response of the room is dispersive. At 2.5 seconds, the echo path is changed from that illustrated in FIG. 6 to the echo path illustrated in FIG. 7. This simulates the movement of a person in the room.

Figure 8:
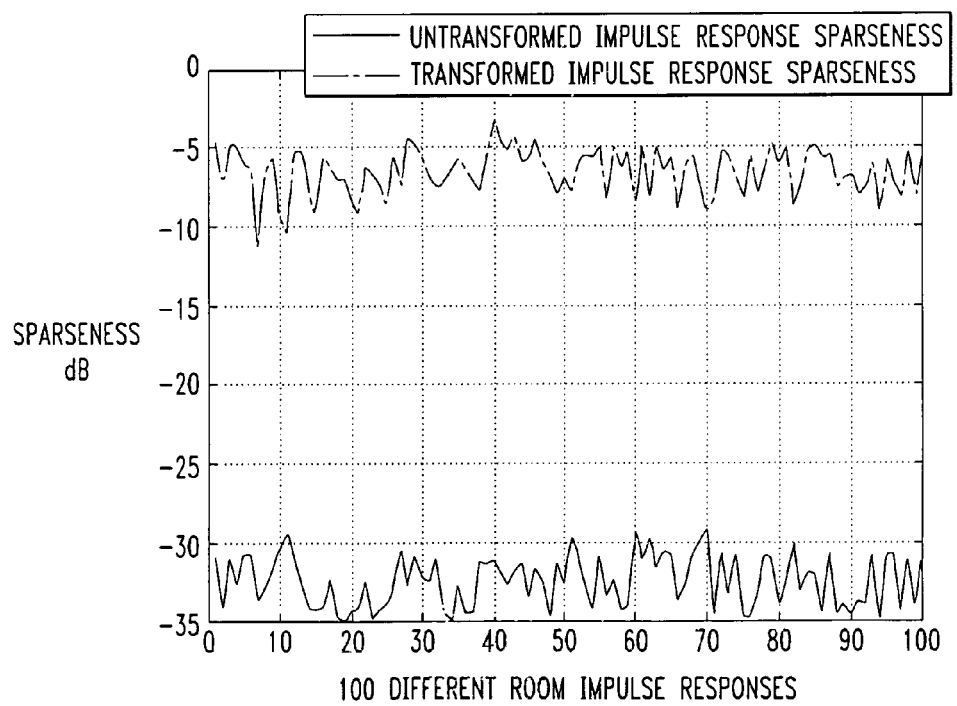
FIG. 8 illustrates a comparison of the sparseness of 100 room impulse responses before and after being transformed by the room's principle components during a fourth simulation.

Referring to FIG. 8, illustrated is a comparison of the sparseness of 100 room impulse responses before and after being transformed by the room's principle components during a fourth simulation. In this comparison, the loudspeaker and microphone were in the same locations used in second and third simulations, as discussed with reference to FIGS. 6 and 7. The 100 different impulse responses were generated by moving the absorbing object randomly around in the room. As illustrated, the transformed impulse responses are consistently sparser than the untransformed impulse response generated using the standard PNLMB technique found in the prior art.

Figure 9:
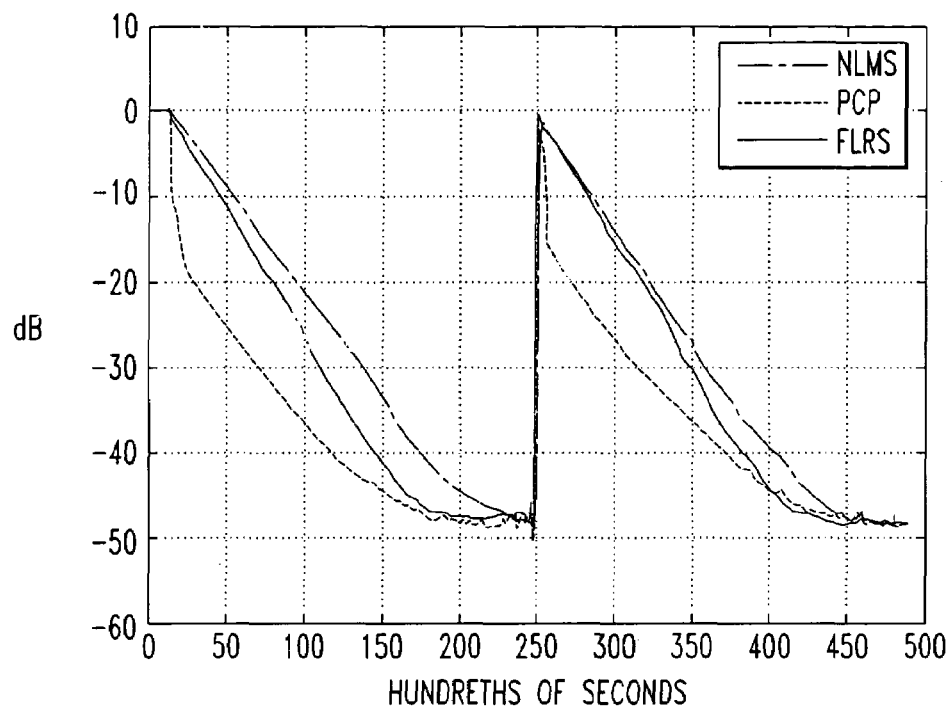
FIG. 9 illustrates the convergence of an adaptive filter employing the PCP approach of the present invention compared to the convergence of adaptive filters employing the NLMS and FRLS algorithms.

Turning to FIG. 9, illustrated is the convergence of an adaptive filter employing the PCP approach of the present invention compared to the convergence of adaptive filters employing the NLMS and FRLS algorithms. In FIG. 9, the principle components of the room having the coordinates of the loudspeaker and microphone are the same as discussed with respect to FIGS. 6 and 7. In addition, it may be seen that the re-convergence of an adaptive filter employing the PCP approach of the present invention is also faster than adaptive filters employing the NLMS or FRLS algorithms.

In the simulations discussed above, the solution vector covariance matrix was first calculated off-line. Then an eigen-decomposition was used to find the transform to make the solution vectors sparse. The calculation of the covariance matrix may be done in real time by periodically adding outer products of good echo path estimates to the current solution vector covariance matrix. Using a forgetting factor (A) on the old solution vector covariance matrix helps an adaptive filter employing PCP progressively to forget old echo paths that may no longer represent the room statistics, should they change with time (e.g., if the loudspeaker and/or microphone are moved). In addition, the eigenvectors of the solution vector covariance matrix must still be found. This is an $O\{L^3\}$ problem, however the eigenvectors do not need to be calculated very often. Specifically, if the locations of the microphone and loudspeaker do not change, the calculation should typically be done about once per day or so.

Furthermore, the vector/matrix multiply in equation (26) is $O\{L^2\}$. At the price of a block delay of L, this complexity may be reduced to $O\{L \log(L)\}$ by using conventional FFT techniques. Those skilled in the pertinent art will understand how to accomplish such calculations, so that discussion will not be repeated here.

Figure 10:
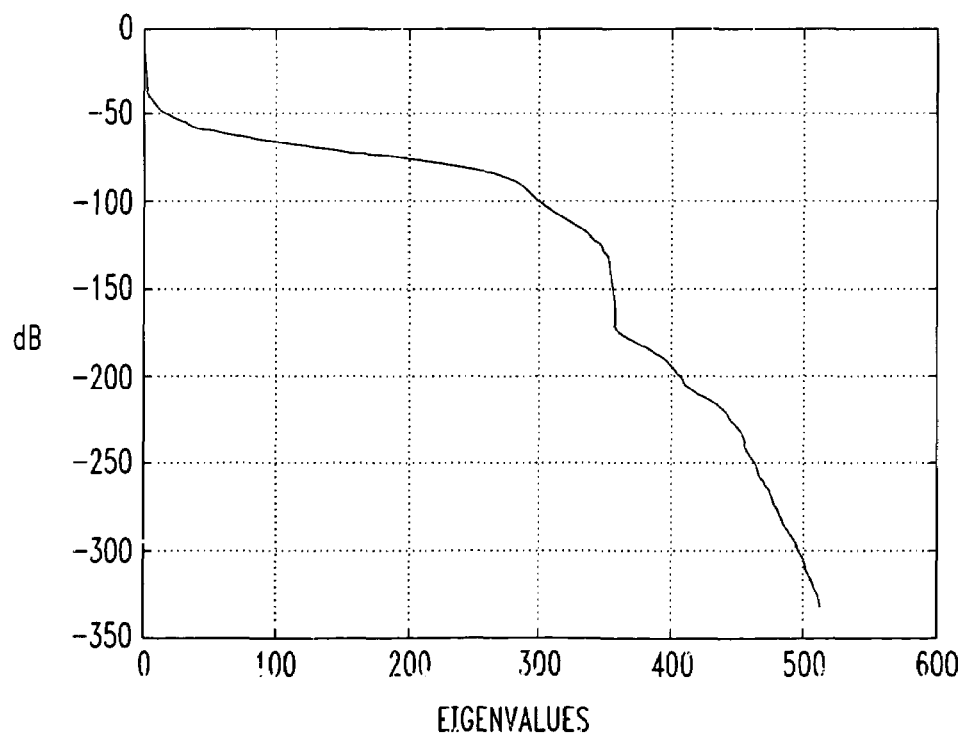
FIG. 10 illustrates the eigenvalues of $\hat{R}_{hh}$, as set forth herein in equations (27) through (29)

Moreover, additional computational savings may be realized by not using every eigenvector in $U^T$. FIG. 10 illustrates the eigenvalues of $\hat{R}_{hh}$, as set forth in equations (27) through (29). From FIG. 10, it is clear that there appears to be a significant null space in the random process that generates the solution vectors. Thus, in one embodiment of the present invention, it is not necessary to include the eigenvectors corresponding to the diminishingly small eigenvalues. In such an embodiment, the only changes in the algorithm of equation (26) is that $U^T$ becomes an M by L matrix, where M<L is the number of significant eigenvalues of $\hat{R}_{hh}$, and the remaining vectors and matrix in the algorithm are of length M and size M-by-M, respectively.

By providing an algorithm for an adaptive filter that employs the principle components of a sampling of solution vectors as the basis set for the accompanying calculations, the resulting PCP algorithm according to the principles of the present invention provides a distinct speed advantage over the conventional algorithms typically employed in adaptive filters. More specifically, although the computational complexity of the PCP approach is higher than that involved with either NLMS or FRLS, the algorithm of the present invention provides convergence speed for the adaptive filter far greater than established conventional algorithms. In addition, as discussed above, the re-convergence speed of an adaptive filter employing PCP according to the present invention is also superior to that of an adaptive filter employing conventional algorithms typically found in prior devices. Those who are skilled in the art understand that faster convergence and re-convergence in an adaptive filter equates to a myriad of benefits, including, but not limited to, increased echo cancellation capability. Moreover, the PCP algorithm of the present invention is employable in almost any adaptive filter, while retaining benefits such as those described above.

Figure 11:
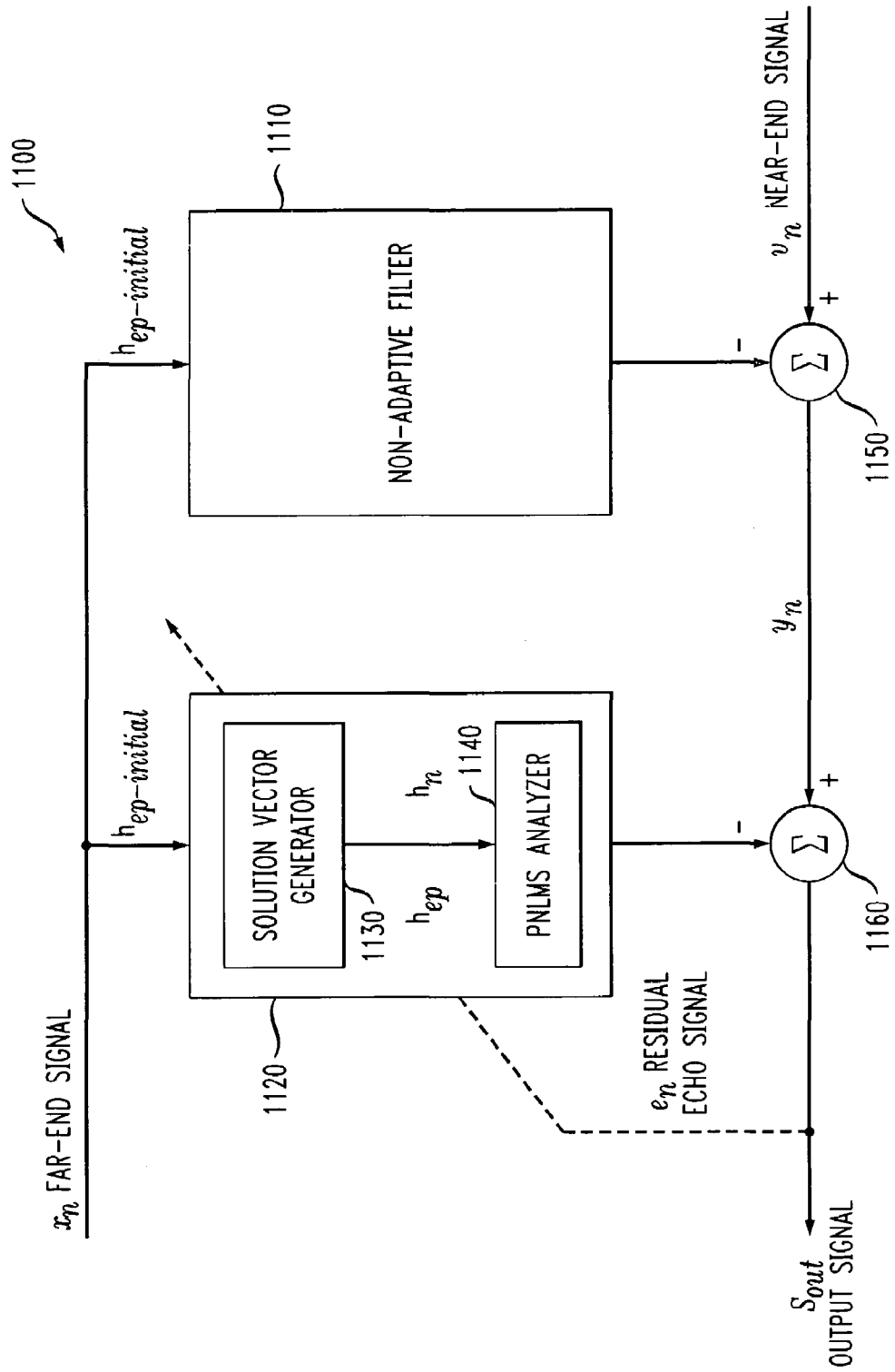
FIG. 11 illustrates a high level block diagram of one embodiment of an echo canceller incorporating the principles of the present invention.

Turning now to FIG. 11, illustrated is a high level block diagram of one embodiment of an echo canceller 1100 incorporating the principles of the present invention. The echo canceller 1100 may be located in a speakerphone, or other similar device where echo cancellation may be beneficial. As illustrated, the echo canceller 1100 includes a non-adaptive filter 1110 having an initial echo path solution vector $h_{ep-initial}$ therein. The non-adaptive filter 1110 passes a signal that has not been adjusted in an effort to cancel the overall echo in a device. More specifically, as audio, such as a human voice, is input to the echo canceller 1100 as a far-end signal $x_n$, for example, an incoming voice through the speaker of a speakerphone, that audio is combined with a near-end signal $v_n$ and echoed back through the device. The near-end audio signal $v_n$ may also be a voice to be transmitted during a conversation, input via a microphone or other similar audio input device.

The echo canceller 1100 also includes an adaptive filter 1120 having an adaptive filter coefficient vector $h_n$ therein. The adaptive filter 1120 is provided in an effort to cancel the signal echoed through the device. As the far-end signal $x_n$ and near-end signal $v_n$ are combined with a first summer 1150, the combined signal $y_n$ is output from the echo canceller 1100. However, before being output sour, the combined signal $y_n$ is sampled, as a residual echo signal $e_n$, and that sample is input to the adaptive filter 1120. The residual echo signal $e_n$ is used to determine how much of the far-end signal $x_n$ remains in the last combined signal $y_n$ output from the device. The adaptive filter 1120 employs the adaptive filter coefficient $h_n$ and the residual echo signal $e_n$, as well as an input of the far-end signal $x_n$, to determine what portion of the combined signal $y_n$ to cancel out of the output signal $S_{out}$, such that the adaptive filter coefficient $h_n$ is updated after each output signal $S_{out}$ leaves the echo canceller 1100. Once the updated determination of what portion of the combined signal $y_n$ should be cancelled is performed by the adaptive filter 1120, a second summer 1160 is employed to remove the far-end signal $x_n$ from the combined signal $y_n$ so that only the near-end signal $v_n$ is output as the output signal $s_{out}$ of the device.

Looking at the adaptive filter 1120 more closely, illustrated is a solution vector generator 1130. In accordance with the principles described herein, the solution vector generator 1130 is configured to develop a sparse expression of the initial solution vector $h_{ep-initial}$. Stated another way, the far-end signal $_n$ may be seen as the initial solution vector $h_{ep-initial}$. In adaptive filters found in the prior art, the PNLMS algorithm is performed on an arbitrary basis set of vectors representing final solution vector $h_{ep}$ for echo cancellation, as mentioned above. According to the present invention, however, the solution vector generator 1130 is employed to determine the principle components of the initial solution vector $h_{ep-initial}$ so that the final solution vector $h_{ep}$ may be as sparse as possible. As discussed in greater detail above, the convergence of an adaptive filter typically increases as the sparseness of the solution vector $h_{ep}$ increases. Therefore, a PNLMS analyzer 1140 is coupled to the solution vector generator 1130 to employ the sparse expression of the initial solution vector $h_{ep-initial}$ (i.e., the solution vector $h_{ep}$) to converge upon the adaptive filter coefficient $h_n$ of the adaptive filter 1120. The solution vector generator 1130 and the PNLMS analyzer 1140 accomplish this in the manner discussed extensively above.

Although the present invention has been described in detail, those skilled in the art should understand that they can make various changes, substitutions and alterations herein without departing from the spirit and scope of the invention in its broadest form.

What is claimed is:

1. An adaptive filter, comprising:
   a solution vector generator that develops a sparse expression of an initial solution vector; and
   a proportionate normalized least mean squares (PNLMS) analyzer, coupled to said solution vector generator, that employs said sparse expression to converge upon at least one coefficient for said adaptive filter.

2. The filter as recited in claim 1 wherein said sparse solution is a linear combination of eigenvectors.

3. The filter as recited in claim 1 wherein said initial solution vector is time-varying.

4. The filter as recited in claim 1 wherein said filter is employed in echo cancellation.

5. The filter as recited in claim 4 wherein said echo cancellation is acoustic.

6. The filter as recited in claim 1 wherein said solution vector generator employs a covariance matrix and an associated diagonal decomposition thereof.

7. The filter as recited in claim 1 wherein said solution vector generator builds a sample covariance matrix to develop said sparse expression.

8. A method of converging on at least one filter coefficient, comprising:
   developing a sparse expression of an initial solution vector; and
   employing said sparse expression in a proportionate normalized least mean squares (PNLMS) process to converge upon at least one coefficient for said adaptive filter.

9. The method as recited in claim 8 wherein said sparse solution is a linear combination of eigenvectors.

10. The method as recited in claim 8 wherein said initial solution vector is time-varying.

11. The method as recited in claim 8 wherein said filter coefficient is employed in echo cancellation.

12. The method as recited in claim 11 wherein said echo cancellation is acoustic.

13. The method as recited in claim 8 wherein said developing comprises employing a covariance matrix and an associated diagonal decomposition thereof.

14. The method as recited in claim 8 wherein said developing comprises building a sample covariance matrix to develop said sparse expression.

15. An adaptive, echo canceling filter, comprising:
   a solution vector generator that develops a sparse expression of an initial, time-varying solution vector; and
   a proportionate normalized least mean squares (PNLMS) analyzer, coupled to said solution vector generator, that employs said sparse expression to converge upon at least one coefficient for said adaptive filter.

16. The filter as recited in claim 15 wherein said sparse solution is a linear combination of eigenvectors.

17. The filter as recited in claim 15 wherein said echo cancellation is acoustic.

18. The filter as recited in claim 15 wherein said solution vector generator employs a covariance matrix and an associated diagonal decomposition thereof.

19. The filter as recited in claim 15 wherein said solution vector generator builds a sample covariance matrix to develop said sparse expression.

* * * * *